(12) United States Patent
Ohno

(10) Patent No.: US 6,454,517 B1
(45) Date of Patent: Sep. 24, 2002

(54) WAFER CARRIER DEVICE

(75) Inventor: Tomohiro Ohno, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/461,096

(22) Filed: Dec. 14, 1999

(30) Foreign Application Priority Data

Dec. 25, 1998 (JP) .......................................... 10-371367

(51) Int. Cl.⁷ .............................................. B65G 49/07
(52) U.S. Cl. ...................... 414/783; 294/64.1; 414/941
(58) Field of Search ........................ 294/64.1; 414/783, 414/936, 941

(56) References Cited

U.S. PATENT DOCUMENTS

| | | | | |
|---|---|---|---|---|
| 5,622,400 A | * | 4/1997 | George | 294/64.1 |
| 5,765,889 A | * | 6/1998 | Nam et al. | 294/64.1 |
| 6,037,733 A | * | 3/2000 | Genov et al. | 414/936 X |
| 6,189,943 B1 | * | 2/2001 | Manpuku et al. | 294/64.1 |
| 6,254,155 B1 | * | 7/2001 | Kassir | 294/64.1 |

FOREIGN PATENT DOCUMENTS

JP 62-252147 * 11/1987 .................. 444/944

* cited by examiner

Primary Examiner—Janice L. Krizek
(74) Attorney, Agent, or Firm—Rader, Fishman & Grauer, PLLC

(57) ABSTRACT

Disclosed is an improved wafer carrier device comprising a wafer holder having at least one suction area in its wafer bearing area, an articulate arm-like extension and turning means for rotating the arm-like extension. The suction area has a plurality of minute suction spots. Each suction spot may be a pore whose diameter is 0.5 or less millimeters, and the number of such pores is 50 or more. Otherwise, each suction spot may be a minute groove whose width is 0.5 or less millimeters, and the number of such minute grooves is 20 or more.

6 Claims, 3 Drawing Sheets

FIG. 7
PRIOR ART
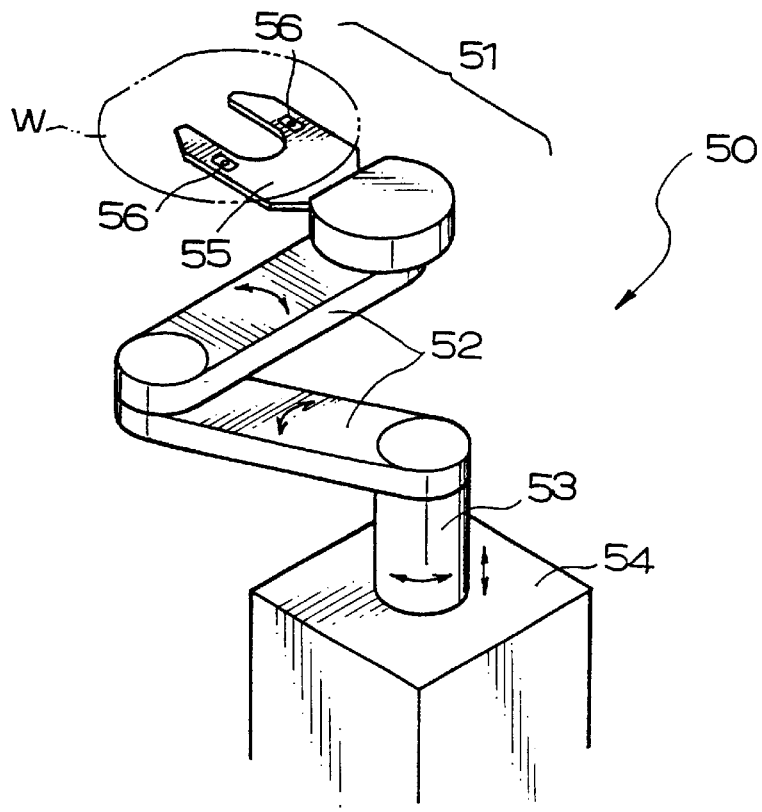
FIG. 8
PRIOR ART
FIG. 9
PRIOR ART
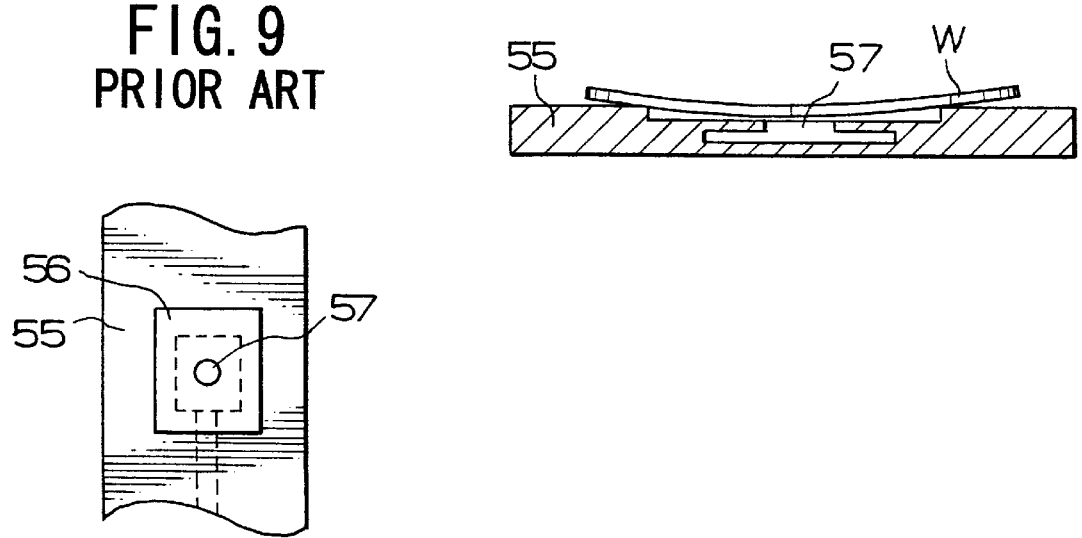

WAFER CARRIER DEVICE

BACKGROUND OF THE INVENTION

1. Field of the Invention

The present invention relates to a wafer carrier device which is to be installed in a wafer grinder.

2. Related Arts

A wafer grinder is designed to handle a cassette containing a plurality of wafers. After being ground, the wafers are put in the cassette to be transferred to the subsequent stage. For this purpose the wafer grinder is equipped with a wafer carrier device 50 for taking out wafers from a cassette and for putting the wafers in another cassette, as seen from FIG. 7.

The wafer carrier device comprises a bifurcate wafer holder 51 having suction areas 56 in its wafer-bearing area 55, an articulate arm-like extension 52 connected to the wafer holder 51, turning means 53 for rotating the arm-like extension 52, and elevating means 54 for raising and descending the arm-like extension 52. A wafer W is put on the bearing area 55, and is positively held by drawing air from the suction areas 56. Then, the wafer W is carried to a desired position with the aid of the arm-like extension 52, and turning and elevating means 52 and 53.

Each suction area 56 has a recess 0.5 millimeters deep, and the recess has a suction hole 57 made at its center, as seen from FIG. 8. The suction hole 57 communicates with a suction source (not shown). The suction hole is circular, and its diameter is for example, 3 millimeters long. The wafer W is laid on the bearing area 55 to be sucked by applying a negative pressure to the suction holes 57 from the suction source. Thus, the wafer W can be positively held on the bearing area 55.

As the recent tendency wafers are ground to minimum thickness; such thin wafers are required in the fields of cellular phones, personal computers and memory cards. Wafers are often ground to be 100 or less microns thick. When such a thin wafer W is sucked and pulled toward the center suction hole 57, it is liable that the wafer is bent badly as shown in FIG. 8, and that the wafer is broken sometimes.

SUMMARY OF THE INVENTION

One object of the present invention is to provide a wafer carrier which can hold by suction, and can transfer a thin wafer without fear of breaking the same.

To attain this object a wafer carrier device comprising a wafer holder having at least one suction area in its wafer-bearing area, an articulate arm-like extension connected to the wafer holder, turning means for rotating the arm-like extension is improved according to the present invention in that the suction area has a plurality of minute suction spots.

Each suction spot may be a pore whose diameter is 0.5 or less millimeters, and the number of such pores is 50 or more.

Each suction spot may be a minute groove whose width is 0.5 or less millimeters, and the number of such minute grooves is 20 or more.

The suction area may be of a piece of porous material.

The wafer holder may have wafer reversing means for turning the wafer up side down.

The minute suction spots cause dispersion of the stress applied to the wafer evenly over the whole suction area, thereby preventing the bending or breaking of the wafer.

Other objects and advantages of the present invention will be understood from the following description of a wafer carrier device according to one preferred embodiment of the present invention, which is shown in accompanying drawings.

BRIEF DESCRIPTION OF THE DRAWING

FIG. 7 is a perspective view of a conventional wafer carrier device;

FIG. 8 illustrates, in section, how the wafer is held on the wafer-bearing area of the wafer holder of the conventional wafer carrier device; and FIG. 9 is a plane view of the wafer-bearing area of the wafer holder of the conventional wafer carrier device.

DETAILED DESCRIPTION OF PREFERRED EMBODIMENT

Figure 1:
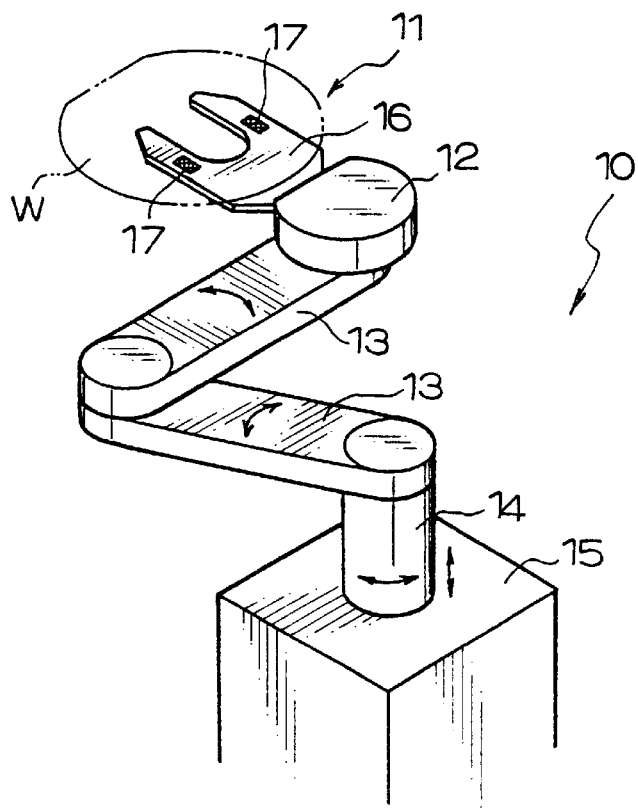
FIG. 1 is a perspective view of a wafer carrier device according to the present invention.

Referring to FIG. 1, a wafer carrier device 10 according to one preferred embodiment of the present invention comprises a bifurcate wafer holder 11 for holding a wafer W, a wafer reversing means 12 for turning the wafer W up side down, an articulate arm-like extension 13 for moving back and forth in a given horizontal plane, turning means 14 for turning the articulate arm-like extension 13 and elevating means 15 for raising and descending the turning means 14.

Figure 2:
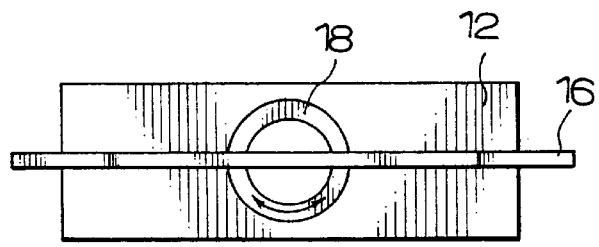
FIG. 2 is a front end view of the wafer holder of the wafer carrier device.

The bifurcate wafer holder 11 has a flat bearing area 16 and two suction areas 17 being, for example, suction panel members and defined in the bearing area 16 symmetrically relative to the longitudinal center line of the bifurcate bearing area 16. The bearing area 16 has a drive such as a stepping motor 18 fixed to its shank, thus permitting the bearing area 16 to turn 180 degrees as indicated by the double-headed arrow in FIG. 2.

Figure 3:
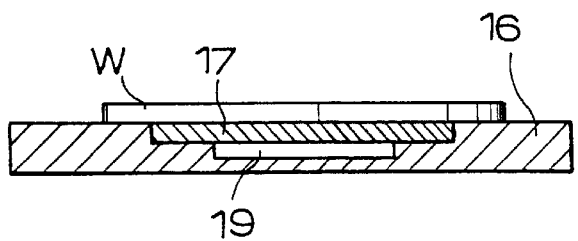
FIG. 3 is a longitudinal section of the wafer-bearing area of the wafer holder.
Figure 4:
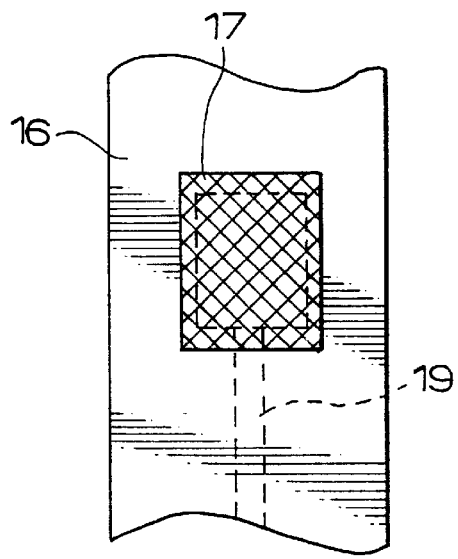
FIG. 4 is a plane view of the wafer-bearing area of the wafer holder.

As seen from FIG. 3, the suction area 17 extends to cover the hole 19, which communicates with the suction source (not shown). The suction area 17 is coplanar with the wafer-bearing area 16. As seen from FIG. 4, the suction area 17 is laid on the end of the conduit 19 to permit application of negative pressure to this limited area.

Figure 5:
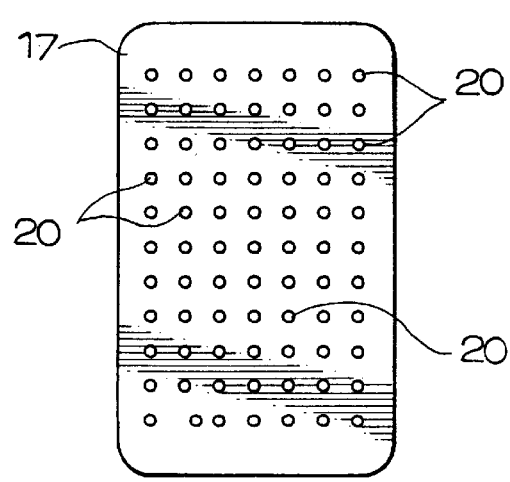
FIG. 5 is a plane view of the suction area of the wafer holder.

As seen from FIG. 5, the suction area 17 has a plurality of minute pores 20 made therein (in the drawing these pores are shown in an exaggerated way).

As shown, these pores 20 are arranged regularly to cause sucking force to appear evenly in the limited area 17. The pores 20 may be holes or slots. For example, they may be 50 or more circular holes, each having a diameter of 0.5 or less millimeters. For another example, they may be 20 or more minute grooves, each being 0.5 or less millimeters wide. The suction area 17 may be provided by embedding a piece of porous material in the wafer-bearing area 16. Otherwise, a plurality of minute holes or slots may be made in the wafer-bearing area 17.

When a wafer W is transferred with the wafer carrier device 10, the wafer W is put on the bearing area 16 of the carrier 10 (see FIG. 1), and then, a negative pressure is applied to the suction areas 17 by the suction source (not shown), thereby causing the wafer W to be sucked and positively held on the suction areas 20. The minute holes 20 are distributed evenly over the whole suction area 17, which is coplanar with the wafer-bearing area 16. Thus, the sucking force appears evenly over the whole suction area 17, thereby preventing the wafer W from being badly bent or broken (see FIG. 3).

Figure 6:
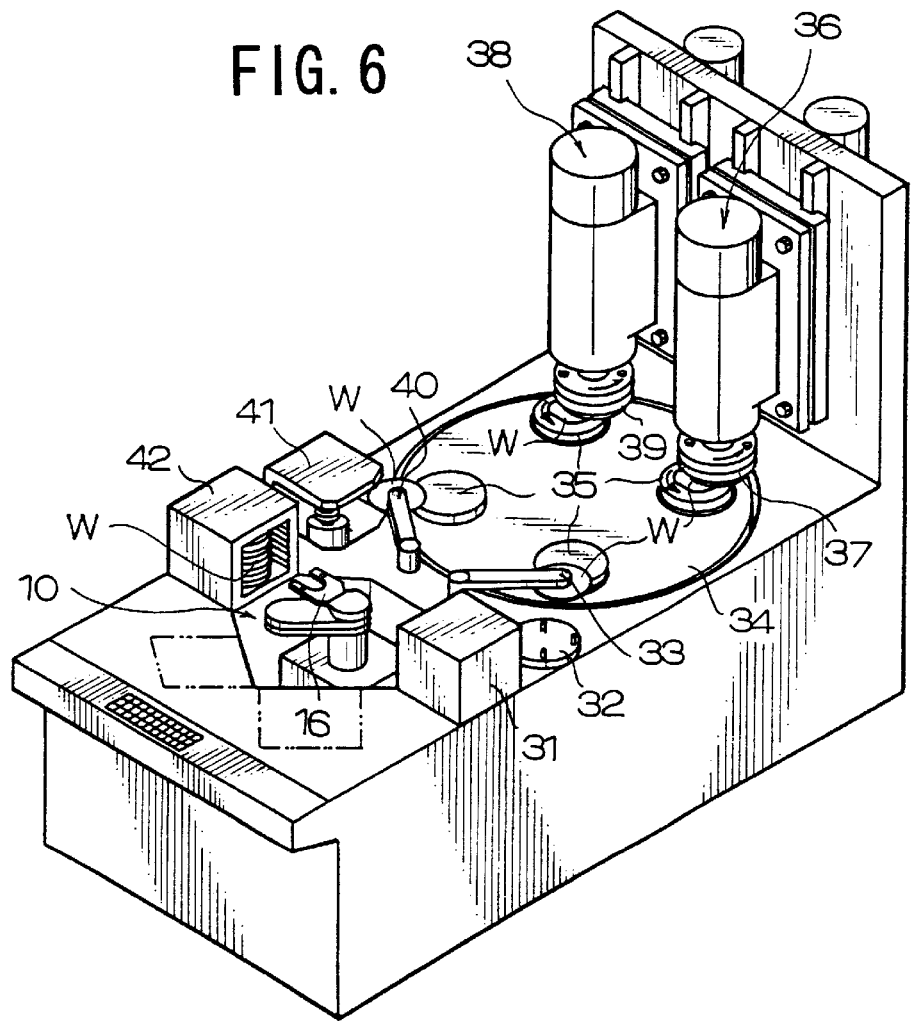
FIG. 6 is a perspective view of a grinder equipped with a wafer carrier device according to the present invention.

The wafer carrier device 10 is installed for instance, in a grinder 30 such as shown in FIG. 6. A plurality of wafers W to be ground are contained in a cassette 31, and the wafer carrier device 10 takes out wafers from the cassette 31 one by one to carry it to the centering table 32.

In taking out a selected wafer W from the cassette 31, first, the elevating means 15 of the wafer carrier device 10 raises or lowers the turning means 14 to the level at which the selected wafer W is laid in the cassette 31. Then, the turning means 14 is rotated to make the articulate arm-like extension 13 to move back and forth, thereby positioning the bifurcate wafer holder 11 to be under the selected wafer W. Then, the selected wafer W is laid on the bearing area 16 to be sucked on the suction areas 17.

The wafer W thus pulled on the suction area is brought just above the centering table 32 by rotating the articulate arm-like extension 13. Then, the wafer-bearing area 16 is turned upside down by the reversing means 12, accordingly making the wafer W to be turned upside down while being sucked and held on the suction areas 17. Then, the wafer holder 11 is lowered by the elevating means 14 to be put on the centering table 32 by removing the negative pressure from the suction areas 17.

The wafer W is put in correct posture by the centering table 32, and the wafer W is transported to a selected chuck table 35 on the turn table 34 by carrier means 33, which is associated with the centering table 32. When the turn table 34 turns a predetermined angle, the wafer W is put under the first grinding means 36. The first grinding means 36 descends while its grindstone 37 is rotated. When the rotating grindstone 37 is put continuously in contact with the wafer W, a coarse grinding is effected.

Then, the turn table 34 turns another predetermined angle, so that the wafer W is put under the second grinding means 38. The second grinding means 38 descends while its grindstone 39 is rotated. When the rotating grindstone 39 is put continuously in contact with the wafer W, a mirror grinding is effected.

After finishing the required grinding the turn table 34 turns still another predetermined angle, so that the wafer W is brought to the washing-and-drying area 41 by carrier means 40, which is associated with the washing-and-drying area 41. The wafer W is washed and dried there, and then it is transferred and put in another cassette 42 by the wafer carrier device 10 as described just below.

In putting the wafer W in the cassette 42 first, the holder 16 turns upside down to have its suction areas 17 directed down, and then the holder 16 is brought to be just above the wafer W in the washing-and-drying area 41. The wafer W is drawn onto the suction areas 17 by applying negative pressure thereto. Sometimes, the wafer W is 100 or less microns thick, but it cannot be broken thanks to the even suction caused.

The wafer-bearing area 16 turns downside up to bear the wafer W thereon, and then, the elevating means 14 raises or descends the articulate arm-like extension 13 to be at a selected level in the cassette 42. The articulate arm-like extension 13 is moved back and forth to put the wafer W in a desired position in the cassette 42, releasing the wafer W there by removing the negative pressure from the suction areas 17. Thus, a series of grinding and boarding works are completed.

As may be understood from the above, a wafer carrier device permits 100 or less micron thick wafers to be held without fear of being broken.

What is claimed is:

1. A wafer carrier device, comprising a wafer holder having at least one suction panel member defining a suction area in its wafer-bearing area, an articulate arm-like extension, turning means for rotating the arm-like extension characterized in that the suction area has a plurality of suction spots, wherein each suction spot is a pore whose diameter is 0.5 or less millimeters, and the number of such pores is 50 or more.

2. A wafer carrier device, comprising a wafer holder having at least one suction area in its wafer-bearing area, an articulate arm-like extension, turning means for rotating the arm-like extension characterized in that the suction area has a plurality of suction spots, wherein each suction spot is a groove whose width is 0.5 or less millimeters, and the number of such grooves is 20 or more.

3. A wafer carrier device, comprising a wafer holder having at least one suction area in its wafer-bearing area, an articulate arm-like extension, turning means for rotating the arm-like extension characterized in that the suction area has a plurality of suction spots, wherein the suction area is a piece of porous material.

4. A wafer carrier device according to any of claims 1 to 3, wherein the wafer holder has wafer reversing means for turning the wafer up side down or vice versa.

5. A wafer carrier device according to claim 1, wherein the wafer holder includes a recess formed into a wafer holder surface thereof and a hole formed into a bottom surface of the recess, and the suction panel member is sized and adapted to be received within the recess.

6. A wafer carrier device according to claim 5, wherein the suction panel member has a top surface disposed in a coplanar relationship with the wafer holder surface when the suction panel member is received within the recess.

* * * * *